(12) United States Patent
Seto et al.

(10) Patent No.: US 11,348,961 B2
(45) Date of Patent: May 31, 2022

(54) PHOTOELECTRIC CONVERSION APPARATUS, PHOTOELECTRIC CONVERSION SYSTEM, AND MOVABLE OBJECT

(71) Applicant: CANON KABUSHIKI KAISHA, Tokyo (JP)

(72) Inventors: Daichi Seto, Kawasaki (JP); Ginjiro Toyoguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 260 days.

(21) Appl. No.: 16/828,611

(22) Filed: Mar. 24, 2020

(65) Prior Publication Data
US 2020/0312893 A1    Oct. 1, 2020

(30) Foreign Application Priority Data
Mar. 29, 2019 (JP) .............................. JP2019-068894

(51) Int. Cl.
*H01L 27/146*     (2006.01)
*H04N 5/232*      (2006.01)
*G06T 7/55*       (2017.01)

(52) U.S. Cl.
CPC .......... *H01L 27/1463* (2013.01); *G06T 7/55* (2017.01); *H01L 27/14603* (2013.01); *H01L 27/14607* (2013.01); *H01L 27/14627* (2013.01); *H01L 27/14643* (2013.01); *H04N 5/23229* (2013.01); *G06T 2207/30252* (2013.01); *H01L 27/14605* (2013.01)

(58) Field of Classification Search
CPC .......... H01L 27/1463; H01L 27/14603; H01L 27/14607; H01L 27/14627; H01L 27/14643; H01L 27/14605; H04N 5/23229
See application file for complete search history.

(56) References Cited

U.S. PATENT DOCUMENTS

2011/0234868 A1    9/2011    Yamashita
2014/0299746 A1   10/2014    Iwata
2017/0047363 A1*   2/2017    Choi ................... H01L 27/1462

FOREIGN PATENT DOCUMENTS

JP          2017-45873 A      3/2017

* cited by examiner

*Primary Examiner* — Thanh Luu
(74) *Attorney, Agent, or Firm* — Canon U.S.A., Inc. IP Division

(57) ABSTRACT

A photoelectric conversion apparatus in one aspect of the present disclosure includes a first semiconductor region of a first conductivity type, a second semiconductor region of the first conductivity type, a third semiconductor region of the first conductivity type, a fourth semiconductor region of a second conductivity type in which a distance from a first surface being greater than a distance from the substrate to the third semiconductor region, a first isolation portion disposed between the first semiconductor region and the second semiconductor region, a microlens commonly disposed in the first semiconductor region and the second semiconductor region, and a fifth semiconductor region of the second conductivity type disposed between the first isolation portion and the fourth semiconductor region. The third semiconductor region is disposed between the fourth semiconductor region and the fifth semiconductor region.

20 Claims, 12 Drawing Sheets

PHOTOELECTRIC CONVERSION APPARATUS, PHOTOELECTRIC CONVERSION SYSTEM, AND MOVABLE OBJECT

BACKGROUND

Field

The present disclosure relates to a photoelectric conversion apparatus.

Description of the Related Art

A known photoelectric conversion apparatus includes a plurality of photoelectric conversion units in one pixel.

Japanese Patent Laid-Open No. 2017-45873 discloses a photoelectric conversion apparatus including a plurality of photoelectric conversion units disposed for one microlens so as to overlap in plan view. Each of the plurality of photoelectric conversion units includes an N-type semiconductor region. A P-type semiconductor region (well region) having a low impurity concentration is disposed as a sensitive region under the N-type semiconductor region of each photoelectric conversion unit. A semiconductor substrate is disposed under the well region. A well region positioned under one N-type semiconductor region and a well region positioned under another N-type semiconductor region are isolated by an isolation region which is a P-type semiconductor region having a higher impurity concentration than the well region. The isolation region reduces the movement of electric charges generated in one well region to another N-type semiconductor region. The movement of the electric charges generated in one well region to another N-type semiconductor region is hereinafter referred to as crosstalk.

In the photoelectric conversion apparatus disclosed in Japanese Patent Laid-Open No. 2017-45873, the isolation region is continuously disposed from a position deeper than the N-type semiconductor regions to the upper surface of the semiconductor substrate to prevent crosstalk. In this case in which the isolation region is continuously disposed, the sensitive region is decreased, decreasing the sensitivity to long-wavelength light.

SUMMARY

The present disclosure provides a photoelectric conversion apparatus in which crosstalk is reduced, with increased sensitivity to long-wavelength light.

A photoelectric conversion apparatus in one aspect of the present disclosure includes a plurality of photoelectric conversion units each including a first semiconductor region and a second semiconductor region, a third semiconductor region, a fourth semiconductor region, a first isolation portion, a microlens, and a fifth semiconductor region. The first semiconductor region is of a first conductivity type in which carriers having a first polarity that is the same polarity as that of a signal charge are set as the majority carriers. The first semiconductor region is disposed in a substrate having a first surface and a second surface opposing the first surface. The second semiconductor region is of the first conductivity type disposed next to the first semiconductor region. The third semiconductor region is of the first conductivity type in which a distance from the first surface is greater than a distance from the first surface of the substrate to the first semiconductor region and the second semiconductor region. The third semiconductor region has an impurity concentration lower than impurity concentrations of the first semiconductor region and the second semiconductor region. The fourth semiconductor region is of a second conductivity type in which carriers having a second polarity are set as the majority carriers and a distance from the first surface is greater than the distance from the first surface to the third semiconductor region. The first isolation portion is disposed between the first semiconductor region and the second semiconductor region. The microlens is commonly disposed in the first semiconductor region and the second semiconductor region. The fifth semiconductor region is of the second conductivity type in which a distance from the first surface is greater than the distance from the first surface to the first semiconductor region and the second semiconductor region, and is disposed between the first isolation portion and the fourth semiconductor region. The third semiconductor region is disposed between the fourth semiconductor region and the fifth semiconductor region and is continuously disposed from between the first semiconductor region and the fourth semiconductor region to between the second semiconductor region and the fourth semiconductor region.

Further features of the present disclosure will become apparent from the following description of exemplary embodiments with reference to the attached drawings.

DESCRIPTION OF THE EMBODIMENTS

Figure 1:
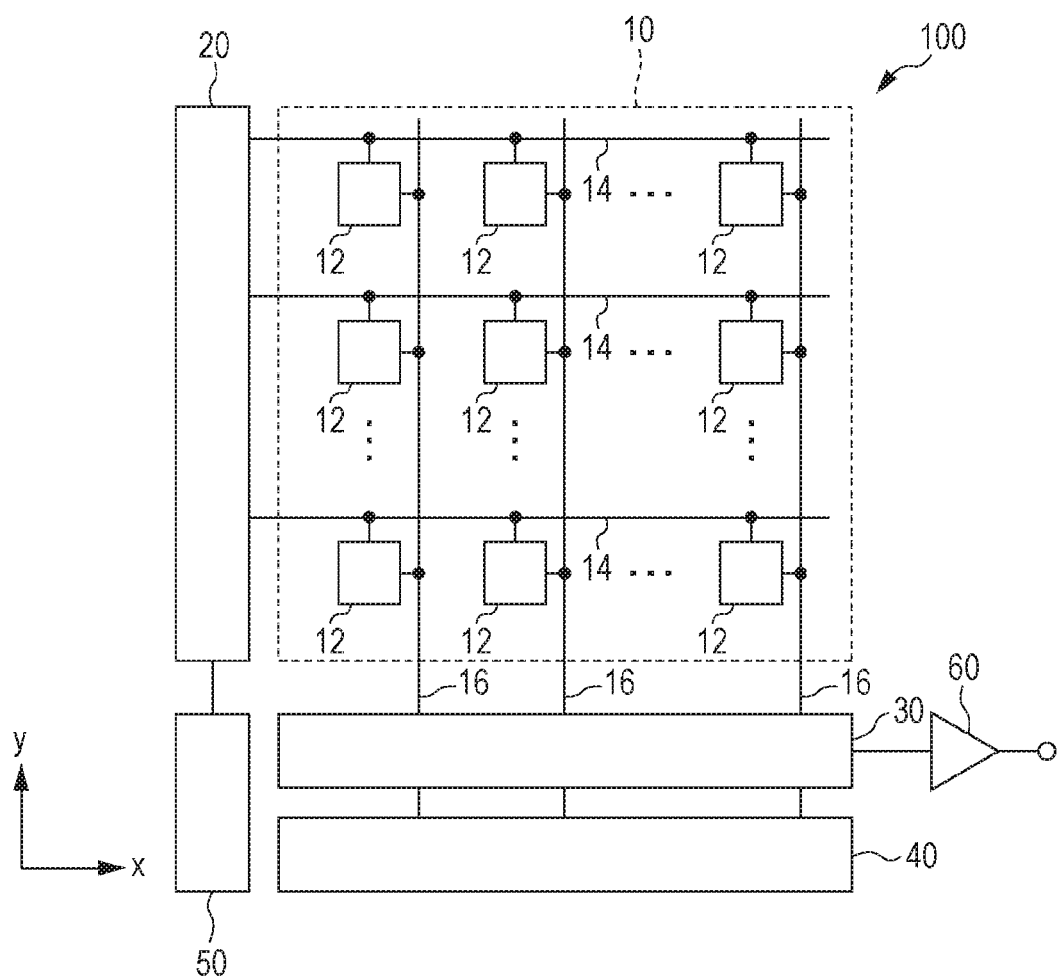
FIG. 1 is a block diagram illustrating the configuration of photoelectric conversion apparatuses according to some embodiments of the present disclosure.

The embodiments described below are given to embody the technical spirit of the present disclosure and are not intended to limit the present disclosure. The sizes and the positional relationship of the components in the drawings are sometimes exaggerated to clarify the illustrations. In the following description, the same components are denoted by the same reference signs, and descriptions thereof is omitted.

In the following description, the signal carrier (signal charge) is an electron. A semiconductor region of a first conductivity type having carriers of a first polarity as the majority carriers is an N-type semiconductor region. A semiconductor region of a second conductivity type having carriers of a second polarity as the majority carriers is a P-type semiconductor region. Even if positive holes are used as signal carriers, the present disclosure still applies. In this case, the semiconductor region of the first conductivity type is used as the P-type semiconductor region, and the semiconductor region of the second conductivity type is used as the N-type semiconductor region.

In the following description, elements and circuits having similar functions are sometimes denoted by the same reference signs, to which different alphabet subscripts are added for distinction. When there is no need to distinguish one from the other, the subscripts, such as a and b, are omitted, and the common part is described.

FIG. 1 is a block diagram illustrating the configuration of photoelectric conversion apparatuses 100 according to some embodiments of the present disclosure. The photoelectric conversion apparatuses 100 each includes a pixel region 10, a vertical scanning circuit 20, a reading circuit 30, a horizontal scanning circuit 40, a control circuit 50, and an output circuit 60.

The pixel region 10 includes a plurality of pixels 12 in multiple rows and multiple columns in a two-dimensional pattern.

The vertical scanning circuit 20 is a circuit unit that supplies control signals for driving reading circuits in the pixels 12 to the pixels 12 through control signal lines 14 provided for the individual rows when reading signals from the pixels 12. Each of the control signal lines 14 is connected to the corresponding pixels 12 arranged in the row direction to serve as a signal line common to the pixels 12. The signals read from the pixels 12 are input to the reading circuit 30 through output lines 16 provided for the individual columns. Each of the output lines 16 is connected to the corresponding pixels 12 arranged in the column direction to serve as a signal line common to the pixels 12.

The reading circuit 30 is a circuit unit that performs signal processing, such as amplification processing and addition processing, on the signals read from the pixels 12. The reading circuit 30 may further include, for example, a differential amplifier circuit, a sample and hold circuit, and an analog-to-digital (AD) conversion circuit.

The horizontal scanning circuit 40 is a circuit that supplies control signals for transferring the signals processed by the reading circuit 30 to the output circuit 60 in sequence for each column to the reading circuit 30.

The control circuit 50 is a circuit that supplies control signals for controlling the operations of the vertical scanning circuit 20, the reading circuit 30, and the horizontal scanning circuit 40, and the timing thereof.

The output circuit 60 is a circuit unit constituted by a buffer amplifier or a differential amplifier, for outputting the pixel signals read from the reading circuit 30 to a signal processing unit outside the photoelectric conversion apparatus 100.

In this specification, the region other than the pixel region 10, that is, the region where the vertical scanning circuit 20, the reading circuit 30, the horizontal scanning circuit 40, the control circuit 50, and the output circuit 60 are disposed, is sometimes referred to as a peripheral circuit region.

Figure 2:
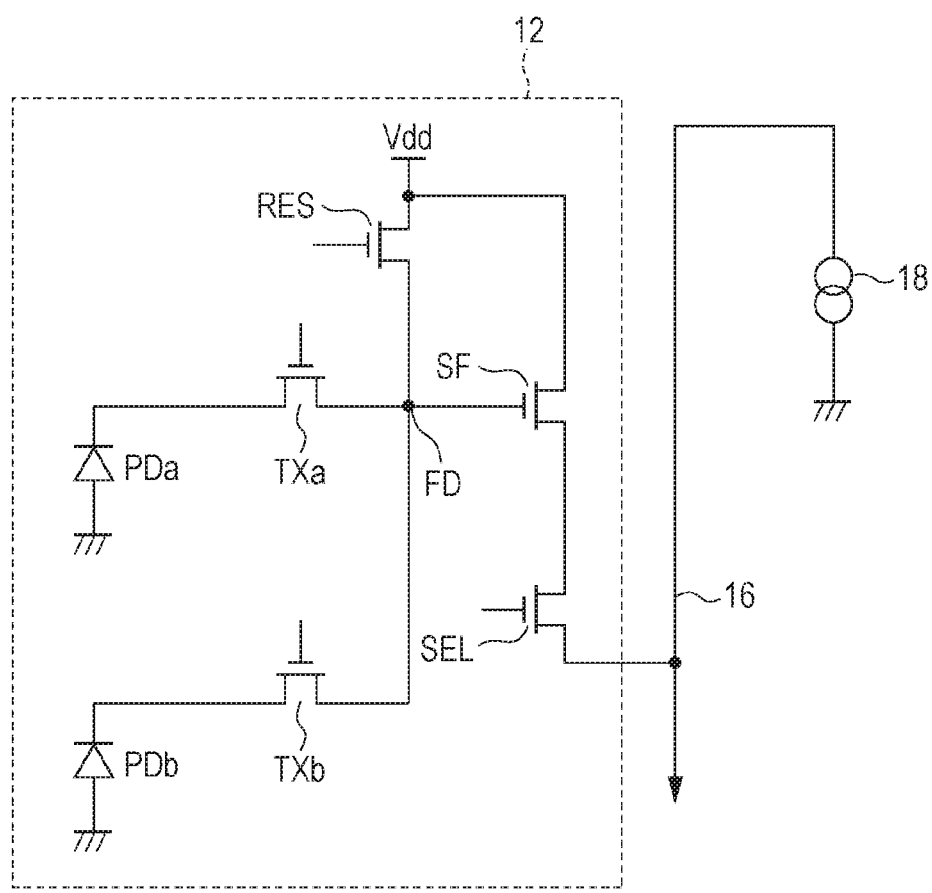
FIG. 2 is an equivalent circuit schematic illustrating the configuration of each pixel of the photoelectric conversion apparatuses according to some embodiments of the present disclosure.

FIG. 2 is an equivalent circuit schematic illustrating the configuration of each pixel 12. The pixel 12 includes photoelectric conversion regions PDa and PDb, transfer transistors TXa and TXb, a reset transistor RES, an amplifier transistor SF, and a selection transistor SEL. The plurality of photoelectric conversion regions PDa and PDb included in one pixel 12 are photoelectric conversion regions that receive light that has passed through one microlens.

The transfer transistors TXa and TXb, the reset transistor RES, and the selection transistor SEL are each controlled by a control signal output from the vertical scanning circuit 20. An example of these transistors is a metal-oxide-semiconductor (MOS) transistor.

The pair of photoelectric conversion regions PDa and PDb photoelectrically convert incident light. The transfer transistors TXa and TXb respectively transfer signal charges generated in the photoelectric conversion regions PDa and PDb to an input node. The input node is a floating diffusion region FD formed at the connection point of the four terminals, the drain terminals of the transfer transistors TXa and TXb, the source terminal of the reset transistor RES, and the gate terminal of the amplifier transistor SF. The floating diffusion region FD holds the signal charges transferred from the photoelectric conversion regions PDa and PDb.

In FIG. 2, the signal charges generated in the photoelectric conversion regions PDa and PDb are transferred to the common floating diffusion region FD. Alternatively, the signal charges generated in the photoelectric conversion regions PDa and PDb may be transferred to different floating diffusion regions.

The amplifier transistor SF constitutes a source follower circuit together with a constant current source 18 and outputs pixel signals based on the amount of signal charges held in the floating diffusion region FD. The selection transistor SEL connects pixels 12 selected according to control signals to the output lines 16. As a result, the pixel signals based on the signal charges held in the floating diffusion region FD of the selected pixels 12 to the output lines 16. The reset transistor RES is connected to a voltage Vdd to reset the signal charges held in the floating diffusion region FD.

Focus detection can be performed based on the signals obtained from the pixel 12. For focus detection, a first signal based on the signal charge generated in the photoelectric conversion region PDa and a second signal based on the signal charge generated in the photoelectric conversion region PDb are output. By calculating the amount of defocus between the first signal and the second signal, phase-contrast focus detection can be performed.

To output a pixel signal for generating an image from the pixel 12, a signal charge generated in the photoelectric conversion region PDa and a signal charge generated in the photoelectric conversion region PDb are added up to generate a signal based on the total signal charge.

First Embodiment

Figure 3:
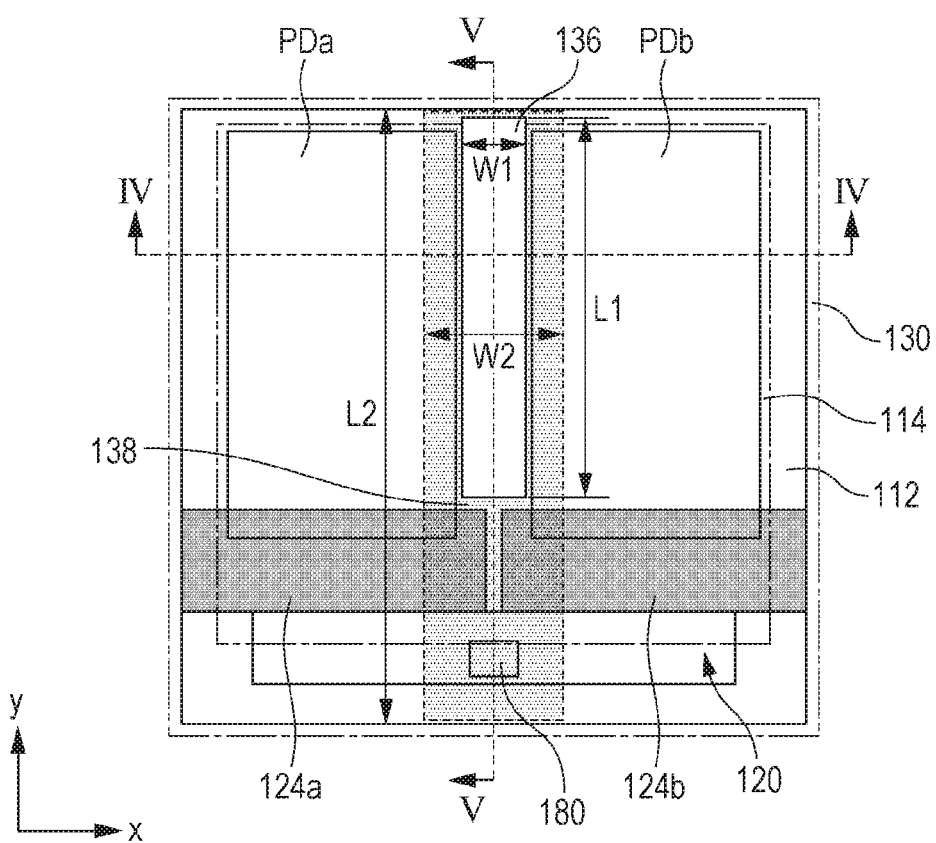
FIG. 3 is a plan view of one pixel of a photoelectric conversion apparatus according to a first embodiment schematically illustrating the configuration thereof.
Figure 4:
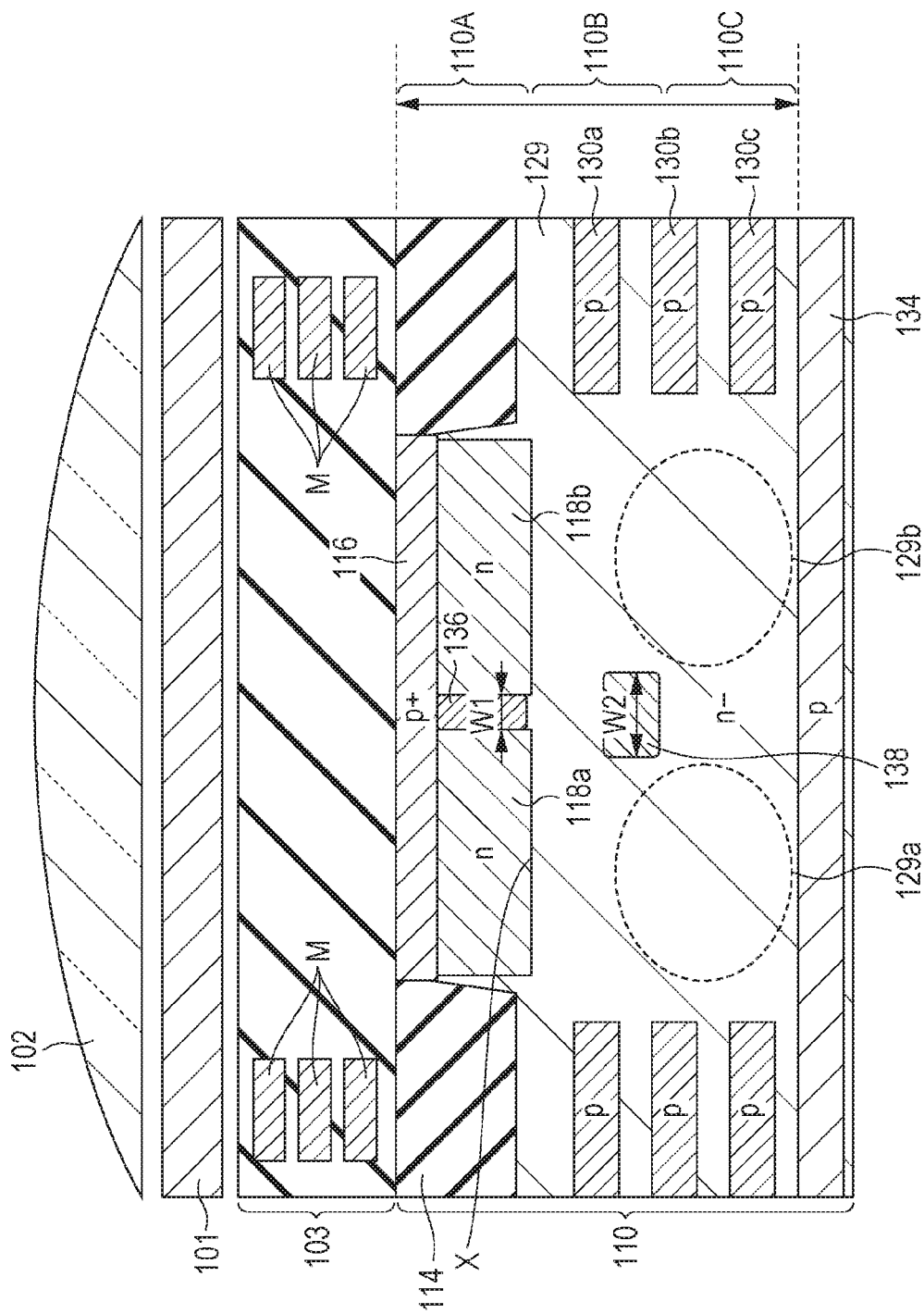
FIG. 4 is a first cross-sectional view of the pixel of the photoelectric conversion apparatus according to the first embodiment schematically illustrating the configuration thereof.
Figure 5:
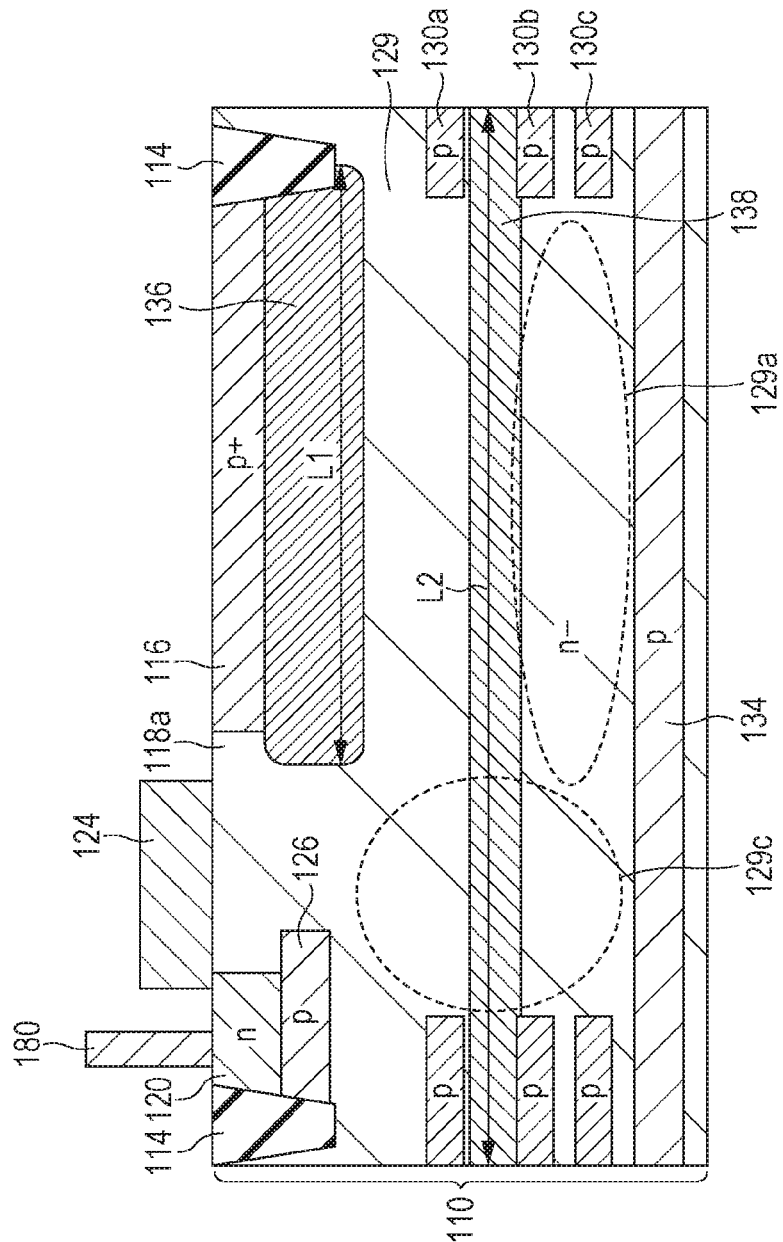
FIG. 5 is a second cross-sectional view of the pixel of the photoelectric conversion apparatus according to the first embodiment schematically illustrating the configuration thereof.

Referring to FIGS. 3 to 5, the configuration of the pixels of a photoelectric conversion apparatus according to a first embodiment will be described. FIG. 3 is a plan view of one pixel of the photoelectric conversion apparatus according to the present embodiment schematically illustrating the configuration thereof. FIG. 4 is a cross-sectional view taken along line IV-IV of FIG. 3. FIG. 5 is a cross-sectional view taken along line V-V of FIG. 3.

The photoelectric conversion apparatus includes a plurality of microlenses, in which one microlens 102 is provided for one pixel 12. A plurality of photoelectric conversion regions PDa and PDb included in one pixel 12 are collectively referred to as a photoelectric conversion unit.

In the pixel 12 illustrated in FIG. 3, an active region 112 is defined by an isolation region 114. The isolation region 114 is composed of, for example, an insulating material. The active region 112 includes the photoelectric conversion regions PDa and PDb and an N-type semiconductor region 120 constituting the floating diffusion region FD. Between the photoelectric conversion region PDa and the photoelectric conversion region PDb in plan view, an isolation portion 136 (a first isolation portion) and a P-type semiconductor region 138 (a fifth semiconductor region) are disposed. The region indicated by a one-dot chain line in FIG. 3 is provided with a P-type semiconductor region 130 separating the pixels 12. The P-type semiconductor region 130 is disposed so as to surround the photoelectric conversion regions PDa and PDb in plan view.

A transfer gate electrode 124 is disposed between the photoelectric conversion region PD and the N-type semiconductor region 120 in plan view. Each transfer transistor TX includes an N-type semiconductor region included in the photoelectric conversion region PDa, the N-type semiconductor region 120, and the transfer gate electrode 124.

A contact region of a contact plug 180 electrically connected to the N-type semiconductor region 120 is positioned on the extension of the isolation portion 136 in the longitudinal direction (Y-direction).

The length L1 of the isolation portion 136 is smaller than the length L2 of the P-type semiconductor region 138. The P-type semiconductor region 138 is disposed so as to overlap with the N-type semiconductor region 120 constituting the floating diffusion region FD in plan view, and the isolation portion 136 is disposed so as not to overlap with the N-type semiconductor region 120 in plan view. Signal charges generated in the photoelectric conversion regions PDa and PDb tend to transfer toward the contact region. If the isolation portion 136 is disposed so as to overlap with the N-type semiconductor region 120 in plan view, the isolation portion 136 is positioned on the signal-charge transfer channel. This reduces the transfer characteristic from the photoelectric conversion region PD to the floating diffusion region. In the present embodiment, the isolation portion 136 is hardly disposed on the transfer channel, which prevents a decrease in transfer characteristic. The isolation portion 136 may not overlap with the transfer gate electrode 124 of the transfer transistor TX. However, even if the isolation portion 136 partially overlaps with the transfer gate electrode 124, the effect of preventing a decrease in transfer characteristic can be given. The isolation portion 136 may be disposed so as to overlap with the N-type semiconductor region 120 constituting the floating diffusion region FD in plan view.

Next, the cross-sectional structure taken along IV-IV of FIG. 3 will be described with reference to FIG. 4.

The photoelectric conversion region PD includes at least an N-type semiconductor region 118. In FIG. 4, the photoelectric conversion region PDa includes a P-type semiconductor region 116, an N-type semiconductor region 118a (a first semiconductor region), and an N-type semiconductor region 129 (a third semiconductor region) having an impurity concentration lower than the impurity concentration of the N-type semiconductor region 118a. The photoelectric conversion region 118PDb includes the P-type semiconductor region 116, an N-type semiconductor region 118b (a second semiconductor region), and the N-type semiconductor region 129.

The semiconductor regions are disposed in a substrate 110. The substrate 110 includes a first surface positioned close to the microlens 102 and a second surface opposed to the first surface. An example of the substrate 110 is a semiconductor substrate, such as a silicon substrate.

The N-type semiconductor region 118 has a low potential for electrons, so that signal charges can be collected. Disposing the P-type semiconductor region 116 between the N-type semiconductor region 118 and the first surface, as illustrated in FIG. 4, reduces entry of unnecessary electric charges generated on the first surface into the N-type semiconductor region 118.

The width W1 of the isolation portion 136 in the direction perpendicular to the longitudinal direction (Y-direction) of the isolation portion 136 (X-direction) in plan view is smaller than the width W2 of the P-type semiconductor region 138 in the X-direction. This makes it easy to reduce crosstalk while providing a sufficient area of the N-type semiconductor region 129.

The isolation portion 136 is disposed between the N-type semiconductor regions 118a and 118b. The isolation portion 136 serves as a potential barrier for the signal charges collected in the N-type semiconductor region 118a. This reduces entry of the signal charges generated in the N-type semiconductor region 118a into the N-type semiconductor region 118b. The isolation portion 136 may be a P-type semiconductor region or may be composed of an insulating material.

In the present embodiment, the N-type semiconductor region 118 and the N-type semiconductor region 129 are in contact at a plane X. Since the N-type semiconductor region 129 having an impurity concentration lower than the impurity concentration of the N-type semiconductor region 118 in which a distance from the first surface is greater than a distance from the first surface to the N-type semiconductor region 118, a depletion layer can be formed to a region (a deep region) away from the first surface. For example, long-wavelength light, such as red light and infrared light, is easily photoelectrically converted in the deep region. In the present embodiment, electrons generated when light entering the deep region is photoelectrically converted are easily collected by drift, so that the sensitivity can be increased.

A P-type semiconductor region 134 (a fourth semiconductor region) is disposed at a position between the N-type semiconductor regions 118a and 118b. The P-type semiconductor region 134 in which a distance from the first surface is greater than a distance from the first surface to the surface X. The P-type semiconductor region 134 functions to define the length for effective collection of signal charges generated by incidence of light. The P-type semiconductor region 134 is disposed so as to overlap with the N-type semiconductor regions 118a and 118b, the isolation portion 136, the N-type semiconductor region 120, and the transfer gate electrodes 124a and 124b in plan view. The P-type semiconductor region 134 may be disposed over the entire pixel 12 in orthogonal projection on the first surface of the substrate 110. The P-type semiconductor region 134 may be formed across a plurality of pixels 12.

The P-type semiconductor region 138 (the fifth semiconductor region) disposed at a position between the isolation portion 136 and the P-type semiconductor region 134. The P-type semiconductor region 138 in which a distance from the first surface is greater than a distance from the first surface to the N-type semiconductor region 118. Disposing the P-type semiconductor region 138 makes it difficult for the electric charges generated in the N-type semiconductor region 129a positioned between the N-type semiconductor region 118a and the P-type semiconductor region 134 to enter the N-type semiconductor region 118b. Likewise, the P-type semiconductor region 138 makes it difficult for the electric charges generated in the N-type semiconductor region 129b between the N-type semiconductor region 118b and the P-type semiconductor region 134 to enter the N-type semiconductor region 118a. Thus, disposing the P-type semiconductor region 138 reduces crosstalk of electric charges generated in the deep region.

As in the photoelectric conversion apparatus disclosed in Japanese Patent Laid-Open No. 2017-45873, the P-type semiconductor region 138 may be continuously disposed to the P-type semiconductor region 134 to reduce crosstalk. However, disposing the P-type semiconductor region 138 continuously to the P-type semiconductor region 134 may reduce the sensitive region in the depth region. Specifically, a P-type semiconductor region having a high impurity concentration is disposed in the region between the N-type semiconductor region 129a and the N-type semiconductor region 129b (the region between the P-type semiconductor region 138 and the P-type semiconductor region 134 in FIG. 7). Accordingly, the region between the N-type semiconductor region 129a and the N-type semiconductor region 129b is not a sensitive region, thus decreasing the sensitive region. This causes lack of sensitivity to long-wavelength light. In particular, the light that has passed through the microlens 102 may tend to be collected to the region between the N-type semiconductor region 129a and the N-type semiconductor region 129b, in which case the lack of sensitivity to the long-wavelength light is noticeable.

In contrast, the present embodiment includes the N-type semiconductor region 129 serving as a sensitive region between the P-type semiconductor region 138 and the P-type semiconductor region 134. The N-type semiconductor region 129 is continuously disposed from between the N-type semiconductor region 118a and the P-type semiconductor region 134 to between the N-type semiconductor region 118b and the P-type semiconductor region 134. This allows the region where light is easy to collect to be functioned as a sensitive region, thereby reducing crosstalk while reducing a decrease in sensitivity.

The P-type semiconductor region 138 may be disposed at the center when the region from the first surface of the substrate 110 to a plane of the P-type semiconductor region 134 nearer to the first surface is divided into three equal parts. Specifically, If the substrate 110 is divided into three equal parts, a first part 110A, a second part 110B, and a third part 110C, from the first surface to the plane of the P-type semiconductor region 134 nearer to the first surface, the P-type semiconductor region 138 is positioned in the second part 110B. The thickness of the P-type semiconductor region 138 is smaller than the length from the first surface to the P-type semiconductor region 138. The thickness of the P-type semiconductor region 138 is smaller than the length from the P-type semiconductor region 134 to the P-type semiconductor region 138. In this specification, "thickness" refers to the length in the direction from the first surface toward the second surface.

Without the P-type semiconductor region 138, the electric charges generated in the N-type semiconductor regions 129a and 129b easily transfer to between the N-type semiconductor regions 118a and 118b of the second part 110B. Disposing the P-type semiconductor region 138 between the N-type semiconductor regions 118a and 118b of the second part 110B makes it easy to reduce crosstalk.

The N-type semiconductor region 129 may be disposed between the isolation portion 136 and the P-type semiconductor region 138. This produces a region where the potential to the signal charges is lower than the potentials of the isolation portion 136 and the P-type semiconductor region 138 between the isolation portion 136 and the P-type semiconductor region 138. This makes it easy for the signal charges overflowing from the saturated N-type semiconductor region 118 to enter the other N-type semiconductor region 118 of the same photoelectric conversion unit. This prevents a decrease in input and output characteristics for light incident on the photoelectric conversion unit. In other words, the signal obtained by adding the signals from the plurality of photoelectric conversion regions of the photoelectric conversion unit is given linearity according to the amount of incident light.

The N-type semiconductor region 129 disposed between the isolation portion 136 and the P-type semiconductor region 138 may be disposed at a position farther away from the first surface than the N-type semiconductor region 118.

The P-type semiconductor region 130 (a second isolation portion) (a sixth semiconductor region) that electrically isolates the photoelectric conversion unit from the adjacent photoelectric conversion unit is disposed between the isolation region 114 and the P-type semiconductor region 134. The P-type semiconductor region 130 includes a plurality of impurity concentration peaks. FIG. 4 illustrates regions 130a, 130b, and 130c of impurity concentration peaks of the P-type semiconductor region 130. Although the regions 130a, 130b, and 130c in FIG. 4 are separated, they may be continuous. In other words, the P-type semiconductor region 130 may be continuous.

The P-type semiconductor region 138 is disposed at a position corresponding to the region between the peak closest to the first surface and the peak closest to the second surface of the plurality of impurity concentration peaks. For example, in FIG. 4, the P-type semiconductor region 130 includes the first impurity concentration peak 130a, the second impurity concentration peak 130b, and the third impurity concentration peak 130c from the first surface to the second surface in this order. The P-type semiconductor region 138 is disposed at a position corresponding to the region between the first impurity concentration peak 130a and the second impurity concentration peak 130b. Thus, the impurity concentration peak of the P-type semiconductor region 138 and the impurity concentration peak of the P-type semiconductor region 130 may differ in position. If the impurity concentration peak of the P-type semiconductor region 138 and the impurity concentration peak of the P-type semiconductor region 130 are at the same height, the potential for the signal charges tends to be high. This may make it difficult for the signal charges to transfer to the N-type semiconductor region 118. In contrast, setting the impurity concentration peaks of the P-type semiconductor region 138 and the impurity concentration peaks of the P-type semiconductor region 130 to different heights may reduce the difficulty in transferring the signal charges. In the present embodiment, since the above-described second part 110B includes the region between the first impurity concentration peak 130a and the second impurity concentration peak 130b, the P-type semiconductor region 138 is positioned between the peak 130a and the peak 130b. If the second part 110B includes a region corresponding to the region between the peak 130b and the peak 130c, the P-type semiconductor region 138 may be positioned between the peak 130b and the peak 130c.

A color filter 101 is disposed between the substrate 110 and the microlens 102. A wiring layer 103 is disposed between the color filter 101 and the substrate 110. FIG. 4 illustrates three wiring lines M disposed at different heights.

As illustrated in FIG. 5, the P-type semiconductor region 138 continues to a region overlapping with the transfer gate electrode 124 in plan view. Furthermore, the P-type semiconductor region 138 continues to a region overlapping with the N-type semiconductor region 120 constituting the floating diffusion region FD in plan view. The P-type semiconductor region 138 and the P-type semiconductor region 130 are in contact with each other. An N-type semiconductor region 129c is positioned at a region overlapping with the transfer gate electrode 124 in plan view. The present embodiment reduces entry of signal charges into the adjacent N-type semiconductor region 118 due to photoelectric conversion at the N-type semiconductor region 129c.

In the case where the isolation portion 136 is a P-type semiconductor region, the isolation portion 136 is formed by ion implantation of a P-type impurity (for example, boron (B)) into the substrate 110. The impurity concentration of the P-type semiconductor region constituting the isolation portion 136 is higher than the impurity concentration of the P-type semiconductor region 130.

As described above, the present embodiment makes it easy to prevent crosstalk of signal charges generated in the deep portion while reducing a decrease in sensitivity. This allows image-plane phase difference focus detection with high accuracy.

Although, in the present embodiment, one pixel 12 includes two photoelectric conversion regions, one pixel 12 may include three or more photoelectric conversion regions.

Second Embodiment

Figure 6:
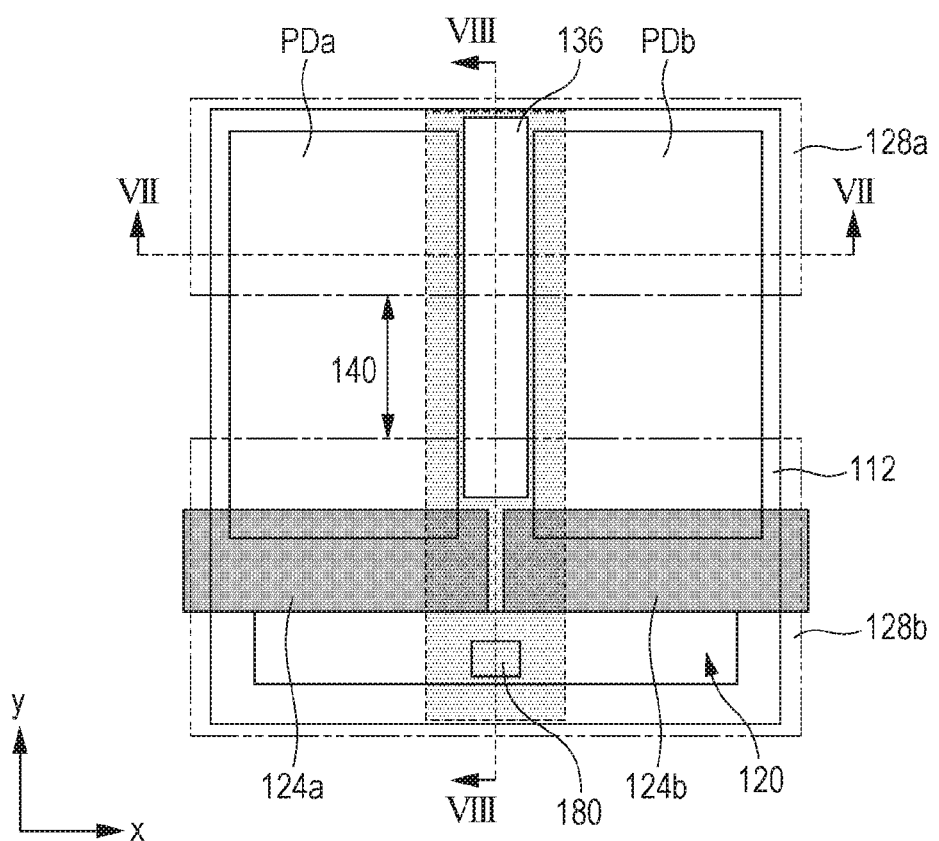
FIG. 6 is a plan view of one pixel of a photoelectric conversion apparatus according to a second embodiment schematically illustrating the configuration thereof.
Figure 7:
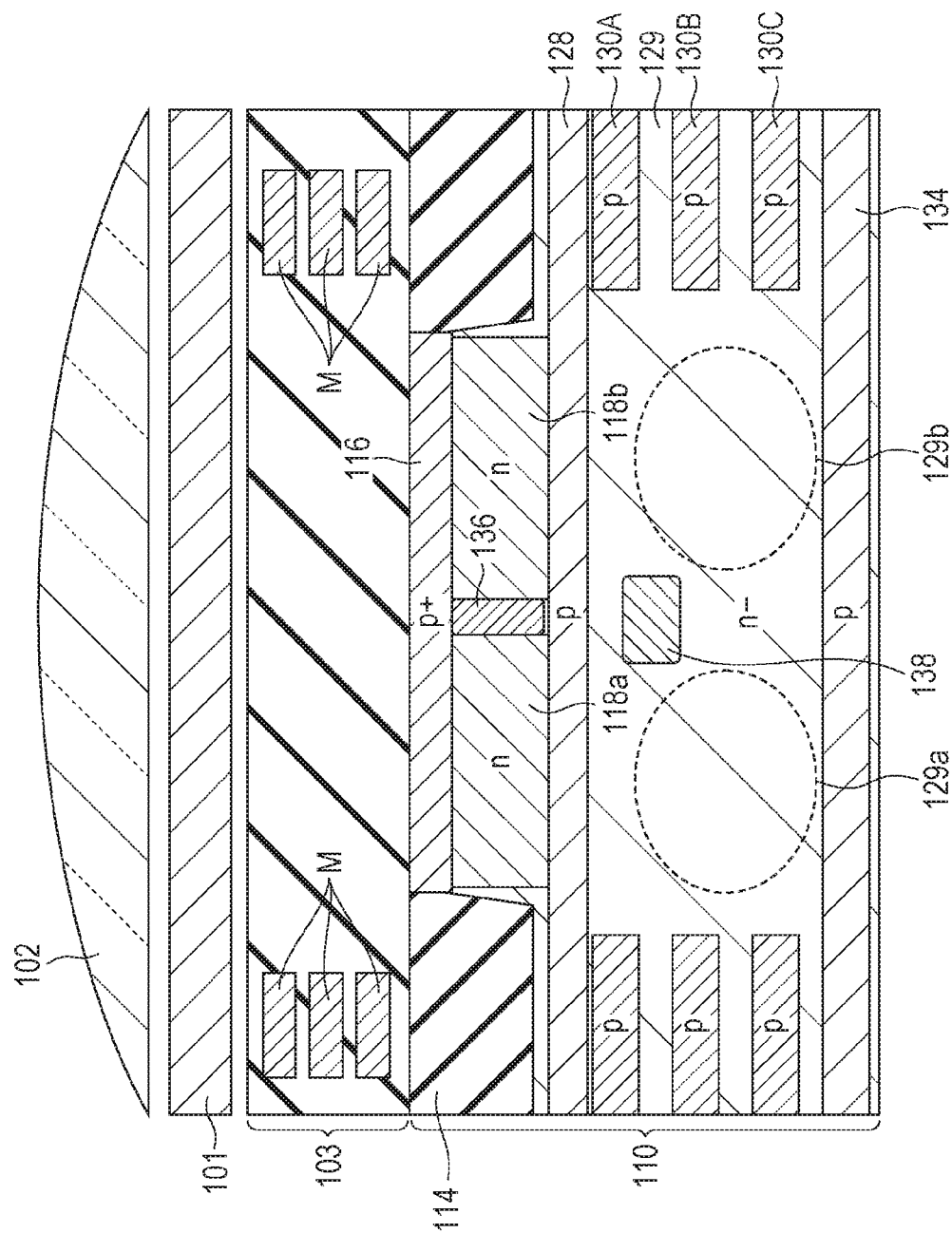
FIG. 7 is a first cross-sectional view of the pixel of the photoelectric conversion apparatus according to the second embodiment schematically illustrating the configuration thereof.
Figure 8:
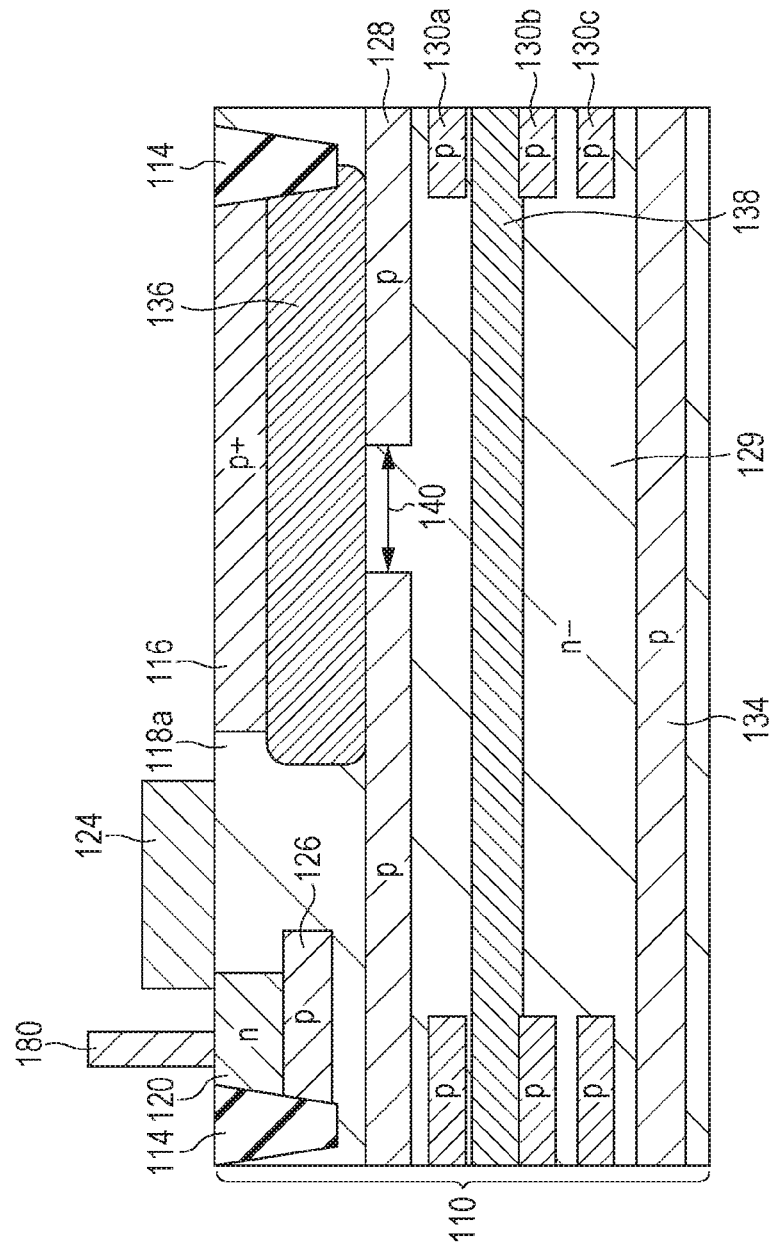
FIG. 8 is a second cross-sectional view of the pixel of the photoelectric conversion apparatus according to the second embodiment schematically illustrating the configuration thereof.

Referring to FIGS. 6 to 8, the configuration of the pixels of a photoelectric conversion apparatus according to a second embodiment will be described. FIG. 6 is a plan view of one pixel of the photoelectric conversion apparatus according to the present embodiment schematically illustrating the configuration thereof. FIG. 7 is a cross-sectional view taken along line VII-VII of FIG. 6. FIG. 8 is a cross-sectional view taken along line VIII-VIII of FIG. 6. The photoelectric conversion apparatus according to the present embodiment differs from the first embodiment in that a P-type semiconductor region 128 (seventh semiconductor region) having a gap 140 is provided between the N-type semiconductor region 118 and the N-type semiconductor region 129.

The P-type semiconductor region 128 is disposed in a region enclosed by the double-dotted chain line in FIG. 6. The P-type semiconductor region 128 is not disposed in the gap 140. The gap 140 is disposed between a P-type semiconductor region 128a and a P-type semiconductor region 128b. The P-type semiconductor region 128 is disposed so as to overlap with the isolation portion 136, part of the N-type semiconductor region 118, the N-type semiconductor region 120, and the transfer gate electrode 124 in plan view.

As illustrated in FIG. 7, the N-type semiconductor regions 118a and 118b and the P-type semiconductor region 128 constitute a junction. The N-type semiconductor region 129 and the P-type semiconductor region 128 constitute a junction. The P-type semiconductor region 128 may be disposed in the entire pixel 12 except part of the N-type semiconductor region 118 in plan view.

In the first embodiment, a depletion layer easily expands from the N-type semiconductor region 118 to the second surface (below the N-type semiconductor region 118 in FIG. 7). In the present embodiment, the P-type semiconductor region 128 constitutes a junction together with part of the N-type semiconductor region 118. This prevents the depletion layer from expanding from the N-type semiconductor region 118 toward the second surface.

Since the P-type semiconductor region 128 is disposed between the N-type semiconductor region 118 and the N-type semiconductor region 129, a P-N junction capacity is formed between the N-type semiconductor region 118 and the P-type semiconductor region 128. When predetermined reverse bias voltage V is applied to the P-N junction of the photoelectric conversion unit PD, the accumulated electric charge amount Q increases with an increase in P-N junction capacity C, as is apparent from the relational expression, electric charge Q=capacity C×voltage V. The signal charges accumulated in the N-type semiconductor region 118 are transferred to the N-type semiconductor region 120 constituting the floating diffusion region FD. However, when the potential of the N-type semiconductor region 118 reaches a predetermined potential determined depending on the power supply voltage or the like, no signal charges are transferred. In other words, the fluctuation amount of the voltage V due to the transfer of the signal charges is determined. Therefore, the amount of saturated electric charges increases in proportion to the P-N junction capacity of the photoelectric conversion unit PD. Therefore, providing the P-type semiconductor region 128 ensures a sufficient saturated electric charge amount of the N-type semiconductor region 118 serving as an electric charge accumulation layer.

The P-type semiconductor region 128 is disposed between the isolation portion 136 and the P-type semiconductor region 134. The N-type semiconductor region 129 may be disposed between the isolation portion 136 and the P-type semiconductor region 128. This makes the potential of the isolation portion 136 lower than the potential of the N-type semiconductor region 129. This makes it easy for the saturated electric charges in one N-type semiconductor region 118 to enter the other N-type semiconductor region 118 in the same photoelectric conversion unit, preventing a decrease in input and output characteristics.

The gap 140 illustrated in FIG. 8 serves as a transfer path for the signal charges generated between the P-type semiconductor region 128 and the P-type semiconductor region 134 of the N-type semiconductor region 129 of the substrate 110 to the N-type semiconductor region 118.

Thus, by appropriately setting the size and shape of the gap 140 and the impurity concentration of the P-type semiconductor region 128, the signal charges generated in the N-type semiconductor region 129 can be quickly collected to the N-type semiconductor region 118. In other words, disposing the gap 140 allows the pixel 12 to have sensitivity equal to that of the first embodiment even if the P-type semiconductor region 128 is provided.

Thus, the photoelectric conversion apparatus of the present embodiment provides an advantageous effect of reducing a decrease in sensitivity while ensuring a sufficient saturated electric charge amount of the N-type semiconductor region, in addition to the advantageous effects described in the first embodiment.

Third Embodiment

Figure 9:
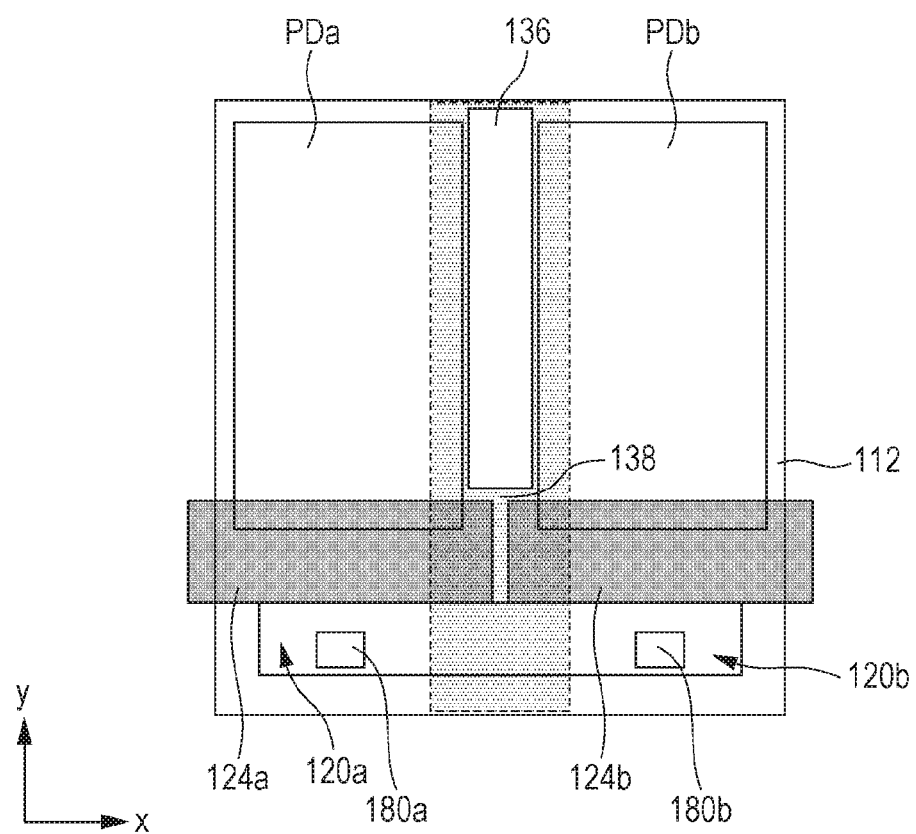
FIG. 9 is a plan view of one pixel of a photoelectric conversion apparatus according to a third embodiment schematically illustrating the configuration thereof.

Referring to FIG. 9, a photoelectric conversion apparatus according to a third embodiment will be described.

The photoelectric conversion apparatus according to the present embodiment differs from the first embodiment in that one N-type semiconductor region 120 constituting the floating diffusion region FD is disposed for one photoelectric conversion region PD, and that one contact plug 180 is connected to one N-type semiconductor region 120.

Also the present embodiment provides the same advantageous effects as the first embodiment.

The configuration of the third embodiment may be combined with the configuration of the second embodiment.

Fourth Embodiment

Figure 10:
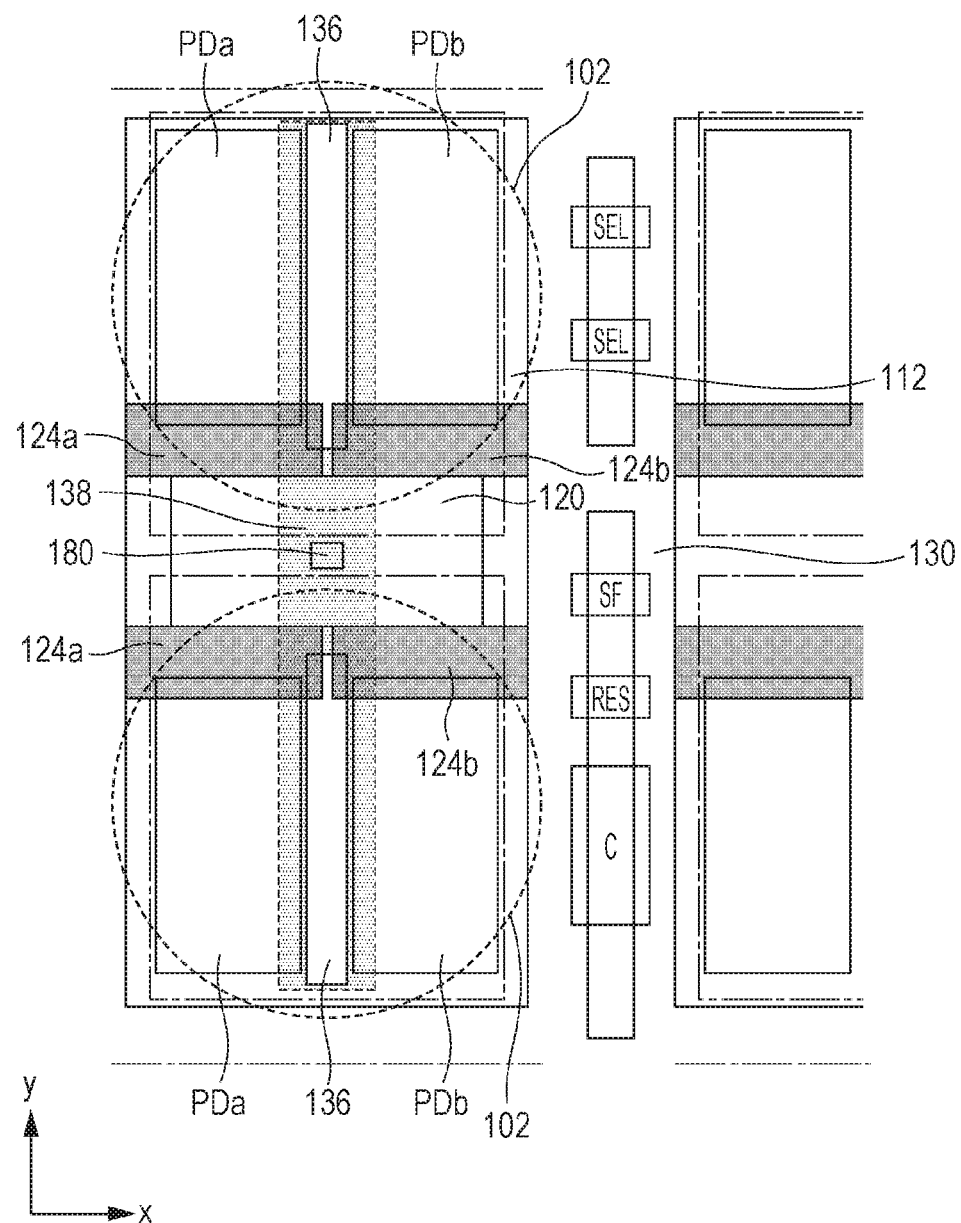
FIG. 10 is a plan view of one pixel of a photoelectric conversion apparatus according to a fourth embodiment schematically illustrating the configuration thereof.

Referring to FIG. 10, a photoelectric conversion apparatus according to a fourth embodiment will be described.

The photoelectric conversion apparatus according to the present embodiment differs from the first embodiment in that a plurality of photoelectric conversion units share one N-type semiconductor region 120 constituting the floating diffusion region FD. FIG. 10 illustrates a selection transistor SEL, an amplifier transistor SF, a reset transistor RES, and a capacitance adding transistor C in a simplified manner.

As illustrated in FIG. 10, the P-type semiconductor region 138 in the present embodiment is disposed across a plurality of photoelectric conversion units. The P-type semiconductor region 130 is disposed across a plurality of photoelectric conversion units.

Fifth Embodiment

Figure 11:
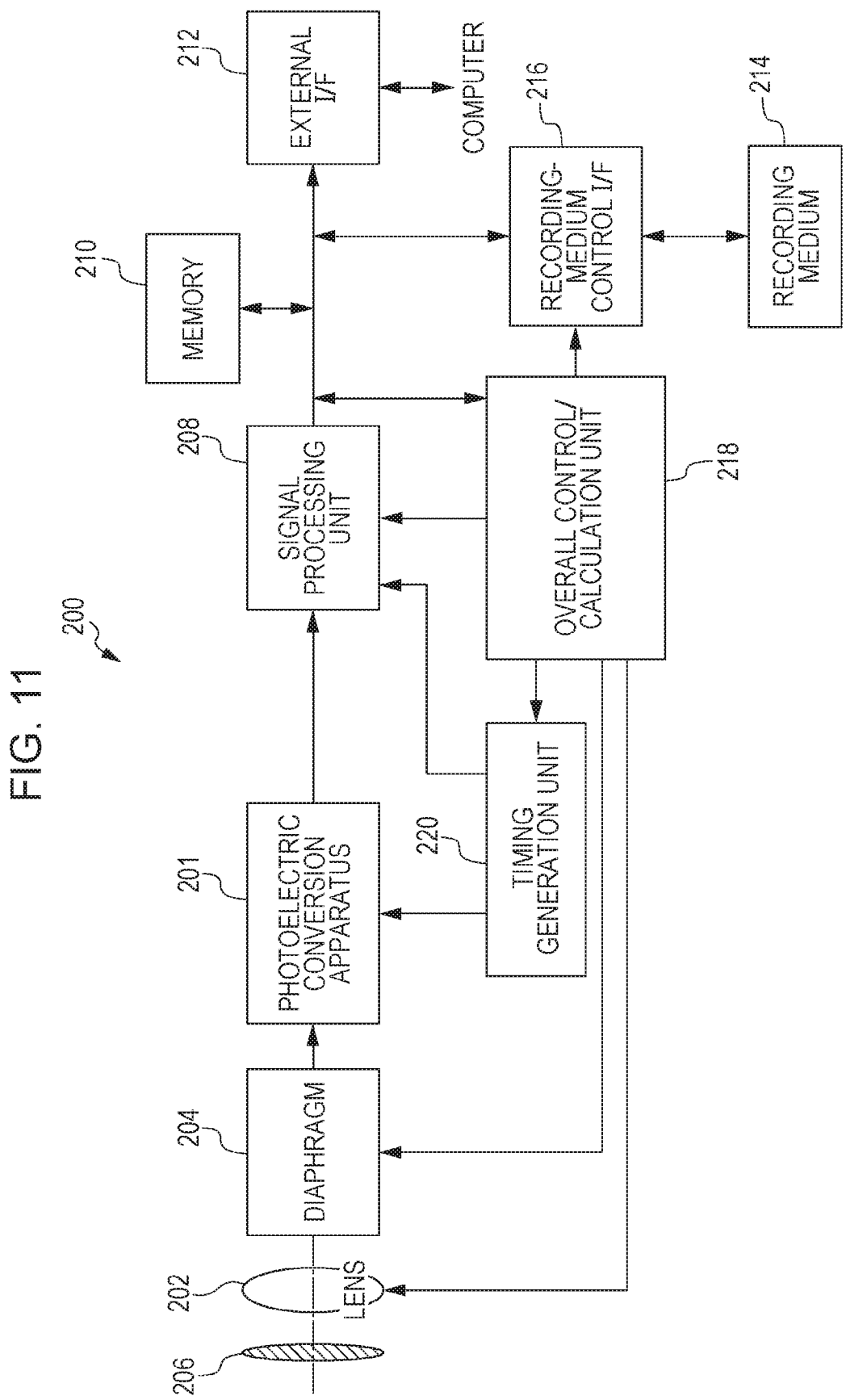
FIG. 11 is a block diagram illustrating, in outline, the configuration of a photoelectric conversion system according to a fifth embodiment.

Referring to FIG. 11, a photoelectric conversion system according to the present embodiment will be described. The same components as those of the photoelectric conversion apparatus of the above embodiments are denoted by the same reference signs, and descriptions thereof will be omitted or simplified. FIG. 11 is a block diagram illustrating, in outline, the configuration of the photoelectric conversion system according to the present embodiment.

The photoelectric conversion apparatuses of the above embodiments can be used in various photoelectric conversion systems as a photoelectric conversion apparatus 201 in FIG. 11. Examples of the applicable photoelectric conversion systems include digital still cameras, digital camcorders, monitoring cameras, copy machines, facsimile machines, mobile phones, on-vehicle cameras, and observation satellites. Another example of the photoelectric conversion systems is a camera module including an optical system, such as a lens, and a photoelectric conversion apparatus. FIG. 11 illustrates a block diagram of a digital still camera by way of example.

A photoelectric conversion system 200 illustrated in FIG. 11 includes the photoelectric conversion apparatus 201, a lens 202 that forms an optical image of the subject on the photoelectric conversion apparatus 201, an aperture 204 for varying the amount of light passing through the lens 202, and a barrier 206 for protecting the lens 202. The lens 202 and the aperture 204 constitute an optical system that focuses the light on the photoelectric conversion apparatus 201. The photoelectric conversion apparatus 201 is the photoelectric conversion apparatus described in each of the above embodiments and converts an optical image formed by the lens 202 to image data.

The photoelectric conversion system 200 further includes a signal processing unit 208 that processes a signal output from the photoelectric conversion apparatus 201. The signal processing unit 208 performs AD conversion for converting an analog signal output from the photoelectric conversion apparatus 201 to a digital signal. The signal processing unit 208 further performs an operation of performing various corrections and compression as necessary to output image data. An AD conversion unit, which is part of the signal processing unit 208, may be formed on the semiconductor substrate on which the photoelectric conversion apparatus 201 is disposed or may be formed on another semiconductor substrate different from the substrate of the photoelectric conversion apparatus 201. The photoelectric conversion apparatus 201 and the signal processing unit 208 may be formed on the same semiconductor substrate.

The photoelectric conversion system 200 further includes a memory 210 for temporarily storing image data and an external interface (external I/F) 212 for communicating with an external computer or another external device. The photoelectric conversion system 200 further includes a recording medium 214, such as a semiconductor memory, for recording or reading captured-image data and a recording-medium control interface (recording-medium control I/F) 216 for recording or reading captured-image data to and from the recording medium 214. The recording medium 214 may be disposed in the photoelectric conversion system 200 or may be detachable.

The photoelectric conversion system 200 further includes an overall control/calculation unit 218 that performs various calculations and control of the entire digital still camera and a timing generation unit 220 that outputs various timing signals to the photoelectric conversion apparatus 201 and the signal processing unit 208. The timing signals may be input from the outside. It is only required that the photoelectric conversion system 200 includes at least the photoelectric conversion apparatus 201 and the signal processing unit 208 that processes signals output from the photoelectric conversion apparatus 201.

The photoelectric conversion apparatus 201 outputs a captured-image signal to the signal processing unit 208. The signal processing unit 208 performs predetermined signal processing on the captured-image signal output from the photoelectric conversion apparatus 201 to output image data. The signal processing unit 208 generates an image using the captured-image signal.

By using the photoelectric conversion apparatuses according to the above embodiments, a photoelectric conversion system capable of acquiring a high-quality image having a large amount of saturation signals with stability and high sensitivity.

Sixth Embodiment

Figure 12A:
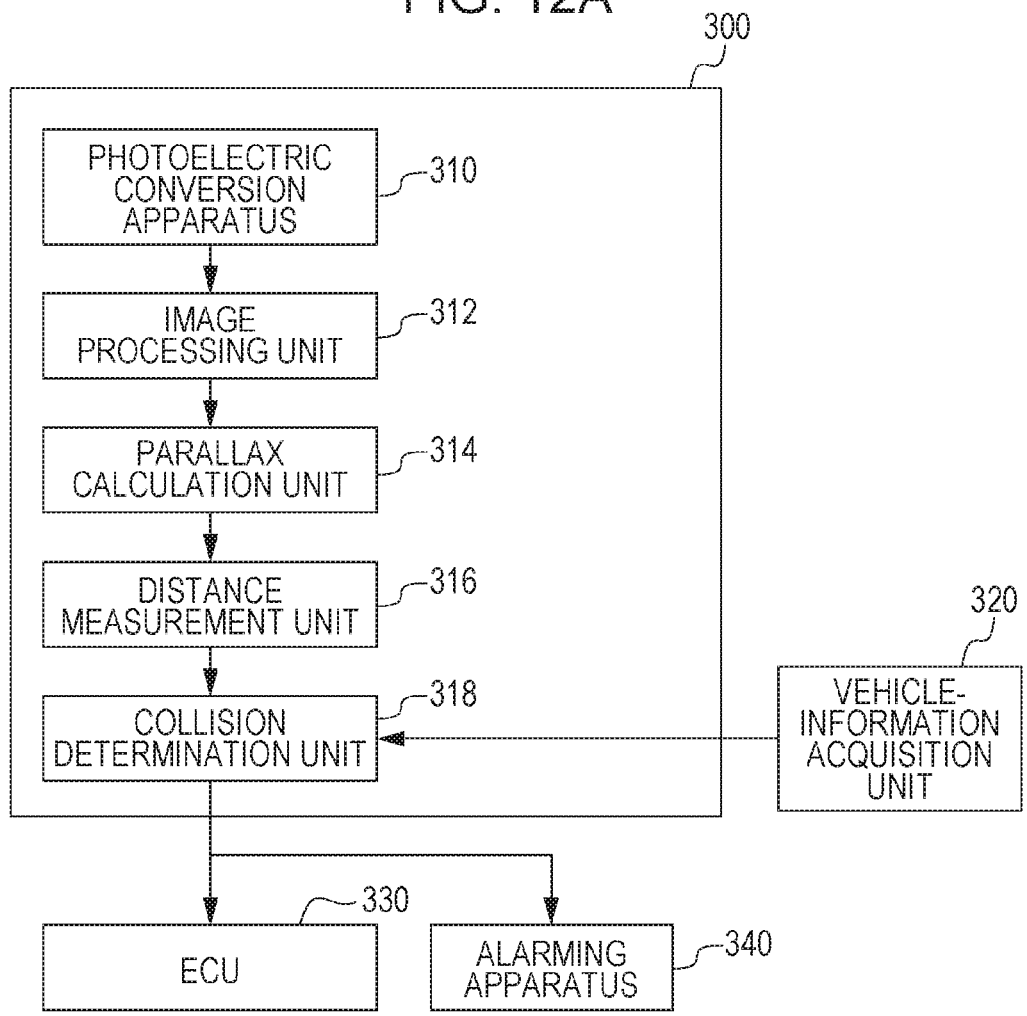
FIGS. 12A and 12B are diagrams illustrating an example of the configuration of a photoelectric conversion system and a movable object according to a sixth embodiment.
Figure 12B:
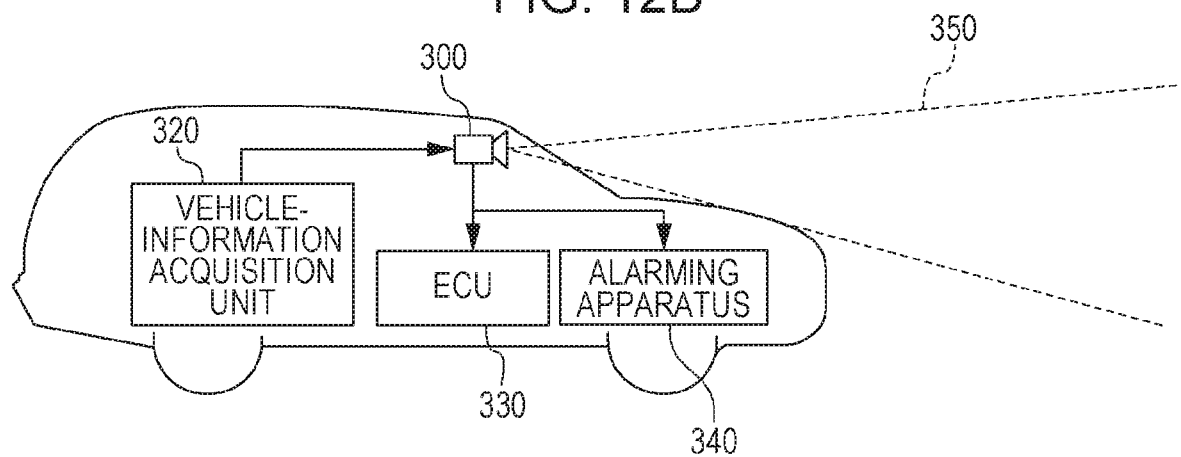

Referring to FIGS. 12A and 12B, a photoelectric conversion system and a movable object according to the present embodiment will be described.

FIG. 12A illustrates an example of a photoelectric conversion system for a car-mounted camera. A photoelectric conversion system 300 includes a photoelectric conversion apparatus 310. The photoelectric conversion apparatus 310 is the photoelectric conversion apparatus described in one of the above embodiments. The photoelectric conversion system 300 includes an image processing unit 312 that performs image processing on a plurality pieces of image data acquired by the photoelectric conversion apparatus 310 and a parallax calculation unit 314 that calculates parallax (the phase difference between parallax images) from the plurality of pieces of image data acquired by the photoelectric conversion system 300. The photoelectric conversion system 300 further includes a distance measurement unit 316 that calculates the distance to the object based on the calculated parallax and a collision determination unit 318 that determines whether there is a possibility of collision based on the calculated distance. The parallax calculation unit 314 and the distance measurement unit 316 are examples of a distance-information acquisition unit for obtaining information on the distance to the object. In other words, the distance information is information on the parallax, the defocus amount, the distance to the object, and so on. The collision determination unit 318 may determine the possibility of collision using any of the distance information. The distance-information acquisition unit 316 may be implemented by specially designed hardware or a software module. The distance-information acquisition unit 316 may be implemented by a field programmable gate array (FPGA), an application specific integrated circuit (ASIC), or a combination thereof.

The photoelectric conversion system 300 is connected to a vehicle-information acquisition unit 320 to obtain a vehicle speed, a yaw rate, a steering angle, and other vehicle information. The photoelectric conversion system 300 is connected to an electronic control unit (ECU) 330, which is a control unit that outputs a control signal for causing the vehicle to generate a braking force based on the determination result of the collision determination unit 318. The photoelectric conversion system 300 is also connected to an alarming apparatus 340 that gives an alarm to the driver based on the determination result of the collision determination unit 318. For example, if the determination result of the collision determination unit 318 shows a high collision possibility, the ECU 330 performs vehicle control of applying the brake, releasing the accelerator, reducing the engine output, or the like to avoid collision or reduce damage. The alarming apparatus 340 gives an alarm to the user by sounding an alarm, displaying alarm information on the screen of a car navigation system or the like, or vibrating the seatbelt or the steering wheel.

In the present embodiment, the surroundings of the vehicle, for example, front or the rear, is shot with the photoelectric conversion system 300. FIG. 12B illustrates the photoelectric conversion system 300 when shooting front of the vehicle (an image capturing range 350). The vehicle-information acquisition unit 320 sends an instruction to perform a predetermined operation to the photoelectric conversion system 300 or the photoelectric conversion apparatus 310. This configuration improves the ranging accuracy.

Although the above is an example of control for preventing a collision with another vehicle, the photoelectric conversion system 300 can also be used to control for automated driving following another vehicle and control for automated driving so as not to go off the lane. The photoelectric conversion system 300 can also be used not only for vehicles, such as automobiles, but also for movable objects (moving apparatuses), such as vessels, airplanes, and industrial robots. In addition to the movable objects, the photoelectric conversion system 300 can also be used for equipment that uses object recognition, such as an intelligent transport system (ITS).

MODIFICATIONS

It is to be understood that the present disclosure is not limited to the above embodiments and that various modifications are possible. For example, an example in which part of the configuration of one of the embodiments is added to another embodiment and an example in which part of the configuration of one of the embodiments is replaced with the configuration of part of another embodiment are also possible.

The present disclosure can reduce crosstalk while increasing sensitivity to long-wavelength light.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-068894, filed Mar. 29, 2019, which is hereby incorporated by reference herein in its entirety.

What is claimed is:

1. A photoelectric conversion apparatus comprising:
   a plurality of photoelectric conversion units each including a first semiconductor region of a first conductivity type in which carriers having a first polarity that is the same polarity as that of a signal charge are set as the majority carriers, the first semiconductor region disposed in a substrate having a first surface and a second surface opposing the first surface, and
   a second semiconductor region of the first conductivity type disposed next to the first semiconductor region;
   a third semiconductor region of the first conductivity type in which a distance from the first surface of the substrate is greater than a distance from the first surface to the first semiconductor region and the second semiconductor region, the third semiconductor region having an impurity concentration lower than impurity concentrations of the first semiconductor region and the second semiconductor region;
   a fourth semiconductor region of a second conductivity type in which carriers having a second polarity are set as the majority carriers, the fourth semiconductor region in which a distance from the first surface being greater than the distance from the first surface to the third semiconductor region;
   a first isolation portion disposed between the first semiconductor region and the second semiconductor region;
   a microlens commonly disposed in the first semiconductor region and the second semiconductor region; and
   a fifth semiconductor region of the second conductivity type in which a distance from the first surface being greater than the distance from the first surface to the first semiconductor region and the second semiconductor region, and disposed between the first isolation portion and the fourth semiconductor region,
   wherein the third semiconductor region is disposed between the fourth semiconductor region and the fifth semiconductor region and is continuously disposed from between the first semiconductor region and the fourth semiconductor region to between the second semiconductor region and the fourth semiconductor region.

2. The photoelectric conversion apparatus according to claim 1, further comprising:
   a floating diffusion region disposed between a first photoelectric conversion unit out of the plurality of photoelectric conversion units and a second photoelectric conversion unit out of the plurality of photoelectric conversion units in plan view, the floating diffusion region receiving electric charges from at least one of the first semiconductor region and the second semiconductor region included in the first photoelectric conversion unit; and a second isolation portion disposed between the first photoelectric conversion unit and the second photoelectric conversion unit, the second isolation portion isolating the first photoelectric conversion unit and the second photoelectric conversion unit from each other.

3. The photoelectric conversion apparatus according to claim 2, wherein the second isolation portion is a sixth semiconductor region of the second conductivity type.

4. The photoelectric conversion apparatus according to claim 3, wherein the fifth semiconductor region is continuously disposed from a region overlapping with the first isolation portion to the sixth semiconductor region in plan view.

5. The photoelectric conversion apparatus according to claim 3,
wherein the sixth semiconductor region has a first impurity concentration peak and a second impurity concentration peak in which a distance from the first surface being greater than a distance from the first surface to the first impurity concentration peak, and
wherein the fifth semiconductor region has an impurity concentration peak in which a distance from the first surface being greater than a distance from the first surface to the first impurity concentration peak, and being closer than the distance from the first surface to the second impurity concentration peak.

6. The photoelectric conversion apparatus according to claim 2, wherein the fifth semiconductor region overlaps with the floating diffusion region in plan view.

7. The photoelectric conversion apparatus according to claim 2, wherein the floating diffusion region is shared by the first photoelectric conversion unit and the second photoelectric conversion unit.

8. The photoelectric conversion apparatus according to claim 2, wherein the first isolation portion is disposed so as not to overlap with the floating diffusion region in plan view.

9. The photoelectric conversion apparatus according to claim 2, wherein the fourth semiconductor region is shared by the first photoelectric conversion unit and the second photoelectric conversion unit in plan view.

10. The photoelectric conversion apparatus according to claim 1, wherein the first isolation portion is a semiconductor region of the second conductivity type.

11. The photoelectric conversion apparatus according to claim 1, wherein the third semiconductor region in which a distance from the first surface is greater than a distance from the first surface to a junction of the first semiconductor region and the third semiconductor region, and is disposed between the first isolation portion and the fifth semiconductor region.

12. The photoelectric conversion apparatus according to claim 1, wherein a width of the first isolation portion in a direction perpendicular to a length of the first isolation portion is smaller than a width of the fifth semiconductor region in the perpendicular direction in plan view.

13. The photoelectric conversion apparatus according to claim 1, wherein, when a region from the first surface to a plane of the fourth semiconductor region closer to the first surface is equally divided into a first part, a second part, and a third part in this order from the first surface to the second surface, the fifth semiconductor region is positioned in the second part.

14. The photoelectric conversion apparatus according to claim 1, wherein a seventh semiconductor region of the second conductivity type is disposed between the first semiconductor region and the third semiconductor region and between the second semiconductor region and the third semiconductor region.

15. The photoelectric conversion apparatus according to claim 14, wherein the first semiconductor region and the second semiconductor region are in contact with the third semiconductor region and the seventh semiconductor region.

16. The photoelectric conversion apparatus according to claim 14, wherein the seventh semiconductor region is continuously disposed so as to overlap with the first semiconductor region, the first isolation portion, and the second semiconductor region in plan view.

17. The photoelectric conversion apparatus according to claim 7, further comprising a capacitance adding transistor.

18. The photoelectric conversion apparatus according to claim 17, wherein the floating diffusion region and a plurality of selection transistors are electrically connected together.

19. A photoelectric conversion system comprising:
the photoelectric conversion apparatus according to claim 1; and
a signal processing unit configured to process a signal output from the photoelectric conversion apparatus.

20. A movable object comprising:
the photoelectric conversion apparatus according to claim 1;
a distance-information acquisition unit configured to obtain information on distance to an object from a parallax image based on a signal from the photoelectric conversion apparatus; and
a control unit configured to control the movable object based on the distance information.

* * * * *